(12) United States Patent
Motoyama et al.

(10) Patent No.: US 11,244,859 B2
(45) Date of Patent: Feb. 8, 2022

(54) INTERCONNECTS HAVING A VIA-TO-LINE SPACER FOR PREVENTING SHORT CIRCUIT EVENTS BETWEEN A CONDUCTIVE VIA AND AN ADJACENT LINE

(71) Applicant: International Business Machines Corporation, Armonk, NY (US)

(72) Inventors: Koichi Motoyama, Clifton Park, NY (US); Cornelius Brown Peethala, Slingerlands, NY (US); Christopher J. Penny, Saratoga Springs, NY (US); Nicholas Anthony Lanzillo, Troy, NY (US); Lawrence A. Clevenger, Saratoga Springs, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 116 days.

(21) Appl. No.: 16/597,966

(22) Filed: Oct. 10, 2019

(65) Prior Publication Data

US 2021/0111069 A1    Apr. 15, 2021

(51) Int. Cl.
*H01L 21/768*    (2006.01)
*H01L 23/522*    (2006.01)
*H01L 23/528*    (2006.01)
*H01L 23/532*    (2006.01)

(52) U.S. Cl.
CPC .. *H01L 21/76885* (2013.01); *H01L 21/76816* (2013.01); *H01L 21/76877* (2013.01); *H01L 23/5226* (2013.01); *H01L 23/5283* (2013.01); *H01L 21/76804* (2013.01); *H01L 21/76846* (2013.01); *H01L 23/53238* (2013.01)

(58) Field of Classification Search
CPC ....... H01L 21/76816; H01L 21/76877–76883; H01L 21/76895; H01L 21/76897; H01L 21/76885; H01L 23/5226; H01L 23/5283; H01L 23/528
See application file for complete search history.

(56) References Cited

U.S. PATENT DOCUMENTS

| | | |
|---|---|---|
| 5,686,354 A | 11/1997 | Avanzino et al. |
| 5,970,376 A | 10/1999 | Chen |
| 6,323,121 B1 | 11/2001 | Liu et al. |

(Continued)

*Primary Examiner* — Yu Chen
(74) *Attorney, Agent, or Firm* — Cantor Colburn LLP; Randall Bluestone

(57) ABSTRACT

Embodiments of the present invention are directed to fabrication method and resulting structures for forming interconnects using a conductive spacer configured to prevent a short between a via and an adjacent line. In a non-limiting embodiment of the invention, a first conductive line and a second conductive line are formed in a metallization layer. A conductive spacer is formed on the first conductive line and a conductive via is formed on a surface of the conductive spacer. The conductive via is positioned such that the conductive spacer is between the first conductive line and the conductive via. A height of the conductive spacer is selected to provide a predetermined distance from the conductive via to the second conductive line. The predetermined distance from the conductive via to the second conductive line is sufficient to prevent a short between the conductive via and the second conductive line.

7 Claims, 10 Drawing Sheets

(56) References Cited

U.S. PATENT DOCUMENTS

| | | |
|---|---|---|
| 6,352,917 B1 | 3/2002 | Gupta et al. |
| 6,867,073 B1 | 3/2005 | Enquist |
| 8,114,769 B1 | 2/2012 | Srivastava et al. |
| 8,835,305 B2 | 9/2014 | Yang et al. |
| 9,379,057 B2 | 6/2016 | Huang et al. |
| 9,455,182 B2 | 9/2016 | Edelstein et al. |
| 9,666,529 B2 | 5/2017 | Huang et al. |
| 10,157,774 B1* | 12/2018 | Peters ................. H01L 29/7838 |
| 10,651,122 B1* | 5/2020 | Bao .................... H01L 23/5226 |
| 2007/0134917 A1 | 6/2007 | Li et al. |
| 2015/0255342 A1* | 9/2015 | Angyal ............... H01L 21/7685 |
| | | 438/653 |
| 2015/0270211 A1* | 9/2015 | Kobrinsky ........ H01L 23/53295 |
| | | 257/758 |
| 2016/0155664 A1* | 6/2016 | Chan ................... H01L 21/3212 |
| | | 438/643 |
| 2016/0163587 A1 | 6/2016 | Backes et al. |
| 2020/0343137 A1* | 10/2020 | Tien ................. H01L 21/76877 |
| 2021/0043507 A1* | 2/2021 | Motoyama ............ H01L 21/288 |
| 2021/0066120 A1* | 3/2021 | Yang ................ H01L 21/76808 |

\* cited by examiner

US 11,244,859 B2

INTERCONNECTS HAVING A VIA-TO-LINE SPACER FOR PREVENTING SHORT CIRCUIT EVENTS BETWEEN A CONDUCTIVE VIA AND AN ADJACENT LINE

BACKGROUND

The present invention generally relates to fabrication methods and resulting structures for semiconductor devices, and more specifically, to fabrication methods and resulting structures for forming interconnects having a via-to-line spacer configured to communicatively couple a conductive via to an underlying conductive line, and further configured to prevent a short circuit event between the conductive via and an adjacent conductive line to which the conductive via is not communicatively coupled.

The fabrication of very large scale integrated (VLSI) or ultra large scale integrated (ULSI) circuits requires the manufacture of sophisticated interconnect structures including metallic wiring that connects individual devices in a semiconductor chip to one another. Typically, the wiring interconnect network consists of two types of features that serve as electrical conductors, namely, line features that traverse a distance across the chip, and conductive via features that connect lines in different levels. The conducting metal lines and conductive vias are made of conductive material, such as aluminum or copper, and are electrically insulated by interlayer dielectrics (ILD). In a multilayered interconnect structure, the metallization layers are referred to as "M" layers (e.g., M1 layer, M2 layer, etc.) while "V" layers denote the conductive vias placed between adjacent M layers (e.g., V1 is between the M1 and M2 layers).

To increase the number of circuits that can be provided on a chip, the semiconductor industry has repeatedly shrunk the transistor gate length and the chip size. As a consequence, the interconnect structure that forms the metallic circuitry has also shrunk. As integrated circuit (IC) feature sizes continue to decrease, the aspect ratio, (i.e., the ratio of height/depth to width) of features such as conductive vias generally increases, complicating the manufacturing process. Fabricating intricate structures of conductive interconnect layers and high aspect ratio vias within increasingly smaller wafer footprints is one of the most process-intensive and cost-sensitive portions of semiconductor IC fabrication.

SUMMARY

Embodiments of the invention are directed to a method for forming interconnects using a conductive spacer configured to prevent a short between a via and an adjacent line. A non-limiting example of the method includes forming a first conductive line and a second conductive line in a metallization layer. The first conductive line is positioned adjacent to the second conductive line. A conductive spacer is formed on the first conductive line and a conductive via is formed on a surface of the conductive spacer. The conductive via is positioned such that the conductive spacer is between the first conductive line and the conductive via. A height of the conductive spacer is selected to provide a predetermined distance from the conductive via to the second conductive line. The predetermined distance from the conductive via to the second conductive line is sufficient to prevent a short between the conductive via and the second conductive line.

Embodiments of the invention are directed to a method for forming interconnects using a conductive spacer configured to prevent a short between a via and an adjacent line. A non-limiting example of the method includes forming a first conductive line and a second conductive line in a metallization layer. The first conductive line is positioned adjacent to the second conductive line. A hard mask is formed over the first conductive line and a first trench is formed in the hard mask. The first trench exposes a surface of the first conductive line. A conductive spacer is formed on a surface of the first conductive line in the trench. The hard mask is removed and an interlayer dielectric is formed over the first conductive line and the conductive spacer. A second trench is formed in the interlayer dielectric. The second trench exposes a surface of the conductive spacer. A conductive via is formed on a surface of the conductive spacer in the second trench.

Embodiments of the invention are directed to an integrated circuit. A non-limiting example of the integrated circuit includes a first conductive line and a second conductive line in a metallization layer of an interconnect structure. The first conductive line is positioned adjacent to the second conductive line. A conductive spacer is positioned on the first conductive line and a conductive via is positioned on a surface of the conductive spacer. The conductive via is positioned such that the conductive spacer is between the first conductive line and the conductive via. A height of the conductive spacer is selected to provide a predetermined distance from the conductive via to the second conductive line. The predetermined distance from the conductive via to the second conductive line is sufficient to prevent a short between the conductive via and the second conductive line.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
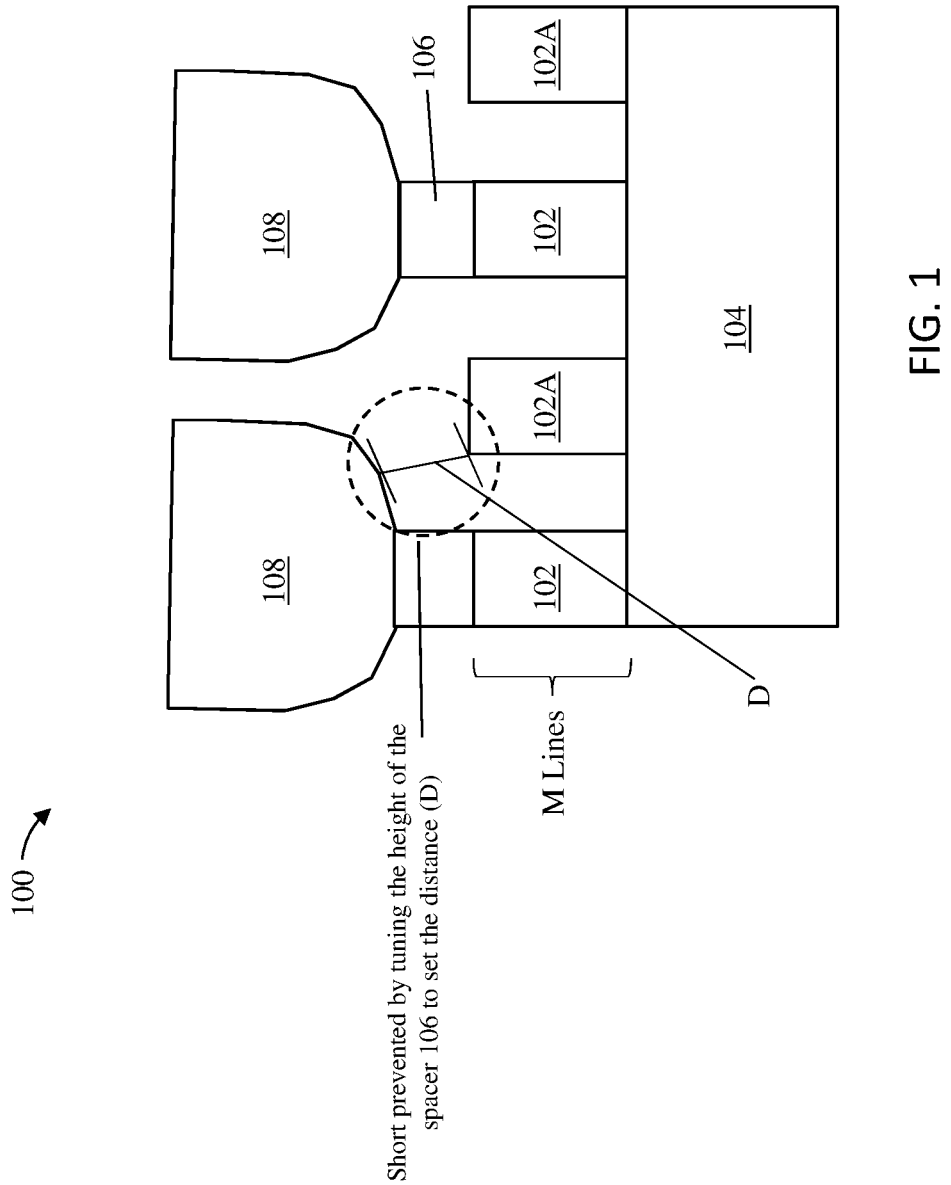
FIG. 1 depicts a cross-sectional view of a portion of an IC having interconnect structures formed thereon according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, ICs are fabricated in a series of stages, including a front-end-of-line (FEOL) stage, a middle-of-line (MOL) stage, and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of source/drain regions, as well as the deposition of metal contacts, can occur during the MOL stage to connect the elements patterned during the FEOL stage. Layers of interconnections (e.g., metallization layers) are formed above these logical and functional layers during the BEOL stage to complete the IC. Most ICs need more than one layer of wires to form all the necessary connections, and as many as 5-12 layers are added in the BEOL process. The various BEOL layers are interconnected by vias that couple from one layer to another.

Insulating dielectric materials are used throughout the layers of an IC to perform a variety of functions, including stabilizing the IC structure and providing electrical isolation of the IC elements. For example, the metal interconnecting wires in the BEOL region of the IC are isolated by dielectric layers to prevent the wires from creating a short circuit with other metal layers.

The continued scaling of semiconductor devices has resulted in challenging fabrication requirements, especially when fabricating ever smaller metallization layers. Advanced BEOL processes incorporate phase-shifting, optical proximity correction, and other practices in an effort to satisfy these scaling demands. These techniques, however, are still subject to patterning errors between features in the interconnect structure. For example, excessive chamfering of a conductive via can cause a via-to-adjacent-line short between the conductive via and an adjacent line feature (e.g., a metal line to which the conductive via is not communicatively coupled). As used herein, a "conductive via" refers to a via that is filled (plugged) with conductive material (as opposed to an unplugged via hole). These via-to-adjacent-line shorts can result in reliability issues or even complete failure in the final device.

Turning now to an overview of aspects of the present invention, one or more embodiments of the invention address the above-described shortcomings of the prior art by providing a new semiconductor structure and a method for forming interconnects using a conductive spacer (sometimes referred to as a pedestal) positioned between a conductive via and a conductive line to which the conductive via is communicatively coupled. The spacer physically prevents a via-to-adjacent-line short even for conductive vias having excessive chamfering. Advantageously, the maximum voltage (Vmax) for interconnects having spacers formed according to one or more embodiments can be increased without causing a via-to-adjacent-line short, improving device performance.

An interconnect structure in accordance with aspects of the invention can be fabricated by forming conductive lines (e.g., metal lines) by patterning the conductive lines into trenches using lithography and an etch. A hard mask is formed over a first conductive line, and the hard mask is opened to expose a surface of the first conductive line. A conductive spacer is formed on the first conductive line. In some embodiments of the invention, the conductive spacer is selectively deposited onto the exposed surface of the first conductive line. A conductive via is formed on a surface of the conductive spacer. The conductive spacer serves to increase the minimum insulator separation (via-to-adjacent-line spacing) between the conductive via and an adjacent (second) conductive line.

Turning now to a more detailed description of aspects of the present invention, FIG. 1 depicts a cross-sectional view of an interconnect structure 100 having a spacer 106 formed according to one or more embodiments of the invention. In FIG. 1, known fabrication operations have been used to form the interconnect structure 100 such that it includes one or more conductive lines 102, 102A (sometimes referred to as "M" layers or as interconnects), a dielectric layer 104, one or more spacers 106, and one or more conductive vias 108, formed in substantially the same manner that is subsequently described herein with respect to FIGS. 3-9. As shown in FIG. 1, the conductive vias 108 are each communicatively coupled through the spacers 106 to a corresponding one of the underlying conductive lines 102. In accordance with aspects of the invention, a height dimension of the spacers 106 can be tuned to set a distance (D) between the conductive vias 108 and the adjacent conductive lines 102A based on a centerline-to-centerline distance between the conductive lines 102 and 102A. In accordance with aspects of the invention, the distance D can be tuned such that D is sufficient to prevent a short between the conductive vias 108 and the adjacent conductive lines 102A, notwithstanding the degree of any chamfering of the conductive vias 108 (although the vias 108 are designed to have nearly vertical walls, in practice the vias 108 can be produced with an extreme chamfer as depicted in FIG. 1).

Figure 2:
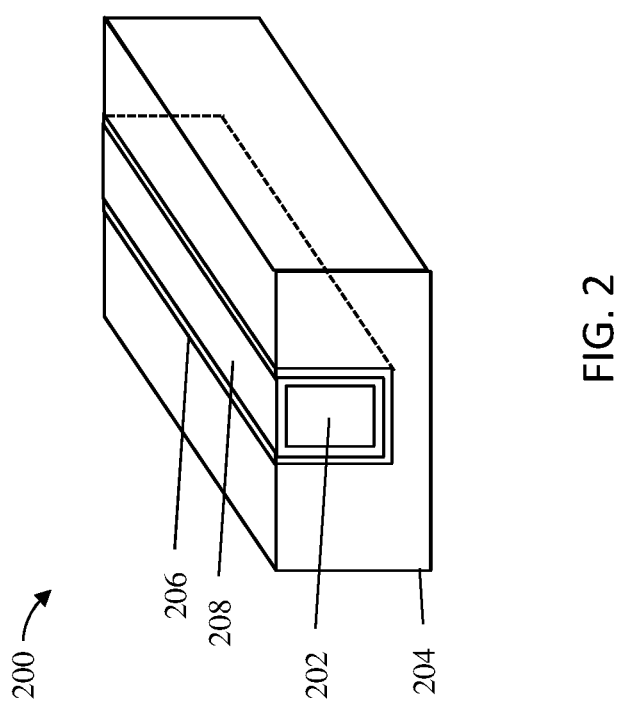
FIG. 2 depicts a cross-sectional view of a semiconductor structure after an initial set of processing operations according to one or more embodiments of the invention.

FIGS. 2-8 depict cross-sectional views of an interconnect structure 200 after an initial set of fabrication operations according to one or more embodiments of the invention. In FIG. 2, known fabrication operations have been used to form the interconnect structure 200 such that it includes a conductive line 202, a dielectric layer 204, a liner 206, and a capping material 208, configured and arranged as shown. While not shown for ease of discussion, the conductive line 202 can be one of many lines in a metallization layer of the interconnect structure 200. Moreover, it is understood that the processes described herein with respect to the conductive line 202 can be used to create spacers in any of these metallization layers.

In some embodiments of the invention, the conductive line 202 includes a conductive material formed or deposited in a trench of a metallization layer using known back-end-of-line (BEOL) processes. In some embodiments of the invention, the conductive line 202 is overfilled above a surface of the trench (not shown), forming overburdens that can be removed using, for example, a chemical-mechanical planarization (CMP) process. The conductive line 202 can be made of any suitable conducting material, such as, for example, metal (e.g., tungsten, titanium, tantalum, ruthenium, zirconium, cobalt, copper, aluminum, platinum), alloys thereof (such as AlCu, CuMn, CuTi, or the like), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the conductive line 202 is a copper line (copper interconnect). The conductive line 202 can be formed or deposited using, for example, CVD, PECVD, PVD, sputtering, plating, chemical solution deposition, and electroless plating.

In some embodiments of the invention, the dielectric layer 204 is an interlayer dielectric. The dielectric layer 204 serves as an isolation structure for the lines and vias of the interconnect structure 200. The dielectric layer 204 can be made of any suitable dielectric material, such as, for example, low-k dielectrics (materials having a small dielectric constant relative to silicon dioxide, i.e., less than about 3.9), ultra-low-k dielectrics (materials having a dielectric constant less than 3), porous silicates, carbon doped oxides, silicon dioxides, silicon nitrides, silicon oxynitrides, silicon carbide (SiC), or other dielectric materials. Any known manner of forming the dielectric layer 204 can be utilized, such as, for example, CVD, PECVD, ALD, flowable CVD, spin-on dielectrics, or PVD.

In some embodiments of the invention, the liner 206 can be formed between the conductive line 202 and the dielectric layer 204. The liner 206 can serve as a diffusion barrier, preventing the copper (or other metal) from diffusing into, or doping, the surrounding dielectric materials, which can degrade their properties. Silicon, for example, forms deep-level traps when doped with copper. An ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese.

In some embodiments of the invention, the capping material 208 is formed around the conductive line 202. The capping material 208 can be formed of any suitable conducting material, such as, for example, metal (e.g., tungsten, titanium, tantalum, ruthenium, zirconium, cobalt, copper, aluminum, platinum), alloys thereof (such as AlCu, CuMn, CuTi, or the like), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the capping material 208 includes a liner and a cap. The liner can be deposited prior to the conductive line 202 (and after forming the liner 206, if present), and the cap can be deposited after. The liner and cap can collectively define the capping material 208.

Figure 3:
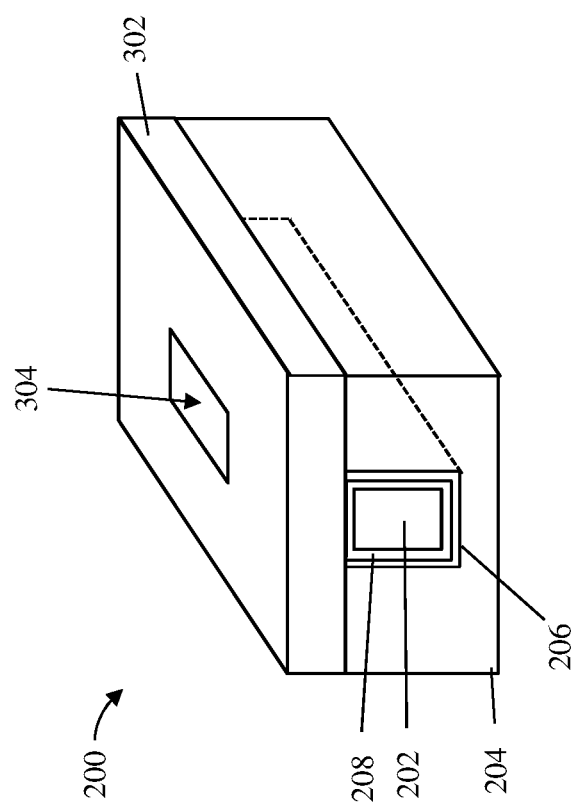
FIG. 3 depicts a cross-sectional view of the semiconductor structure after additional processing operations according to one or more embodiments of the invention.

FIG. 3 depicts a cross-sectional view of the interconnect structure 200 after a processing operation according to one or more embodiments of the invention. In some embodiments of the invention, a line hard mask 302 is deposited or formed on a top surface of the conductive line 202. The line hard mask 302 can be formed using any suitable process, such as chemical vapor deposition (CVD), plasma-enhanced CVD (PECVD), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), atomic layer deposition (ALD), flowable CVD, spin-on dielectrics, physical vapor deposition (PVD), molecular beam epitaxy (MBE), chemical solution deposition, spin-on dielectrics, or other like process.

The line hard mask 302 can be made of any suitable dielectric material, such as, for example, a low-k dielectric, a nitride, silicon nitride, silicon oxide, SiON, SiC, SiOCN, or SiBCN. In some embodiments of the invention, the line hard mask 302 is a silicon nitride or silicon oxide hard mask. In some embodiments of the invention, the line hard mask 302 is formed to a thickness of about 10 nm to about 60 nm, for example 30 nm, although other thicknesses are within the contemplated scope of the invention.

In some embodiments of the invention, the line hard mask 302 is formed over a plurality of conductive lines (including the conductive line 202). In some embodiments of the invention, the line hard mask 302 is formed of a same material on all of the lines. In some embodiments of the invention, even and odd lines can include a same or different material for the line hard mask 302. For example, an even line can include SiN and an odd line can include SiOx/SoG, or vice versa.

As further shown in FIG. 3, portions of the line hard mask 302 can be removed (cut or patterned) using a lithographic process to form one or more trenches 304. In some embodiments of the invention, portions of the line hard mask 302 are removed using a wet etch, a dry etch, or a combination of sequential wet and/or dry etches. In some embodiments of the invention, the liner hard mask 302 is patterned using a reactive ion etch (RIE). In some embodiments of the invention, the trench 304 exposes a surface of the conductive line 202. In other words, portions of the capping material 208 can be removed in the trench 304.

Figure 4:
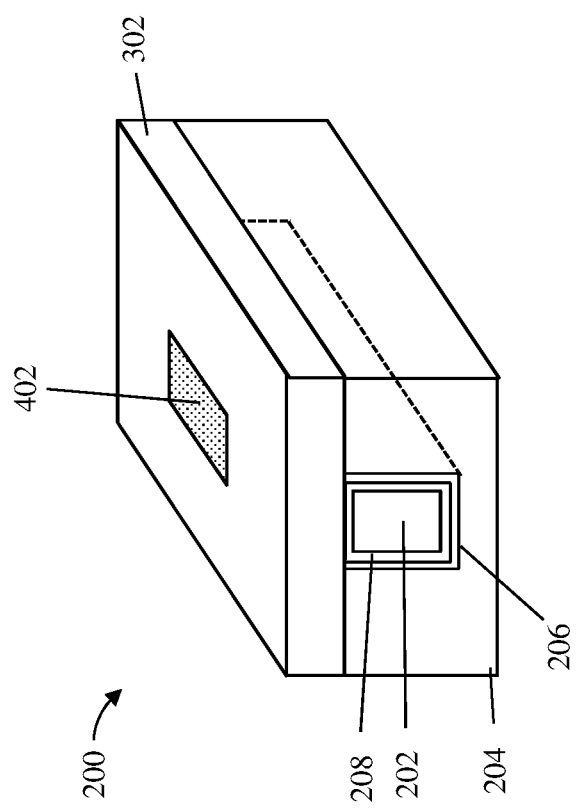
FIG. 4 depicts a cross-sectional view of the semiconductor structure after additional processing operations according to one or more embodiments of the invention.

FIG. 4 depicts a cross-sectional view of the interconnect structure 200 after a processing operation according to one or more embodiments of the invention. In some embodiments of the invention, a conductive spacer 402 (a pedestal) is formed or otherwise deposited into the trench 204.

In some embodiments of the invention, the conductive spacer 402 includes a conductive material that is overfilled above a surface of the trench 304, forming an overburden that can be removed using, for example, a chemical-mechanical planarization (CMP) process. In some embodiments of the invention, the conductive spacer 402 is selectively plated onto an exposed surface of the conductive line 202 using known processes. For example, ruthenium can be selectively plated onto a copper surface using electrochemical plating.

The conductive spacer 402 can be made of any suitable conducting material, such as, for example, metal (e.g., tungsten, titanium, tantalum, ruthenium, zirconium, cobalt, copper, aluminum, platinum), alloys thereof (such as AlCu, CuMn, CuTi, or the like), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the conductive spacer 402 is formed from a conductive material that can be selectively deposited or formed on a surface of the conductive line 202. In some embodiments of the invention, the conductive spacer 402 is formed from ruthenium. The conductive spacer 302 can be tuned to any desired height by adjusting the thickness of the line hard mask 302. In some embodiments of the invention, the conductive spacer 402 is formed to a height of 5 nm to 50 nm, for example 10 nm, although other conductive spacer heights are within the contemplated scope of the invention.

Figure 5:
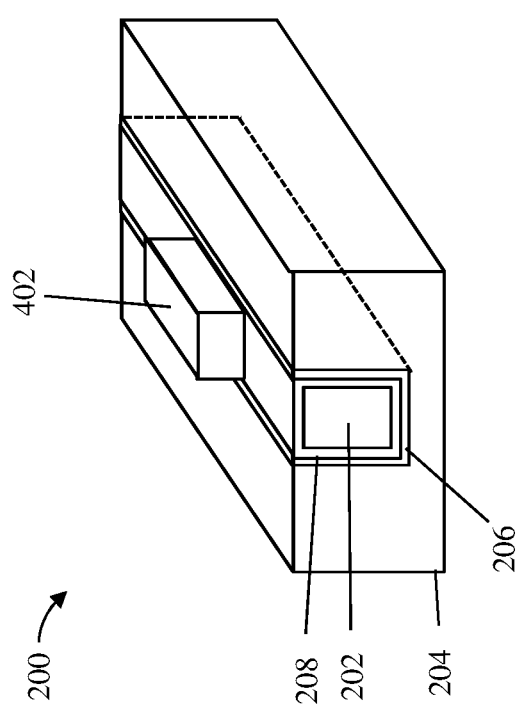
FIG. 5 depicts a cross-sectional view of the semiconductor structure after additional processing operations according to one or more embodiments of the invention.

FIG. 5 depicts a cross-sectional view of the interconnect structure 200 after a processing operation according to one or more embodiments of the invention. In some embodiments of the invention, the line hard mask 302 is removed to expose sidewalls of the spacer 402. In some embodiments of the invention, the line hard mask 302 is removed using a wet etch, a dry etch, or a combination of sequential wet and/or dry etches. In some embodiments of the invention, the line hard mask 302 is removed selective to the spacer 402 and/or the liner 206.

Figure 6:
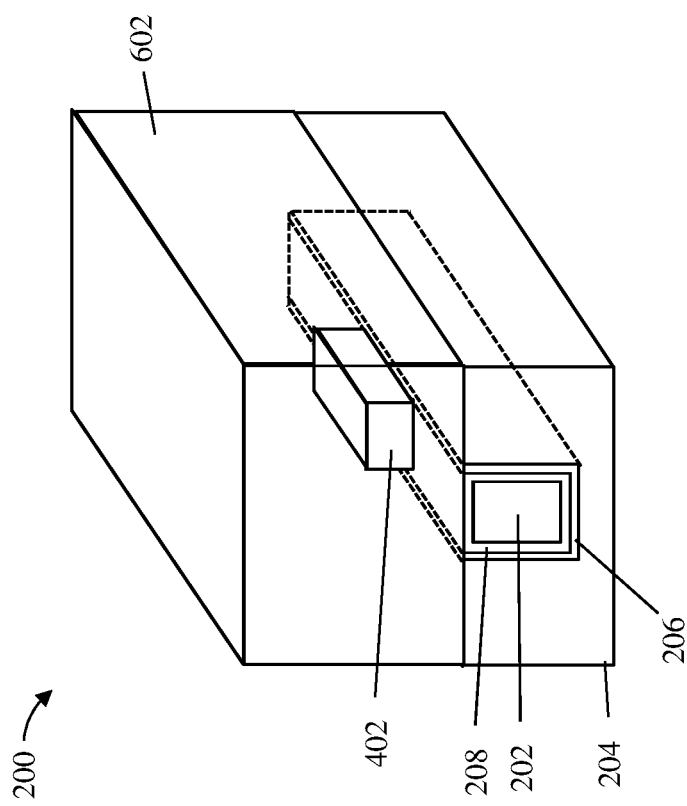
FIG. 6 depicts a cross-sectional view of the semiconductor structure after additional processing operations according to one or more embodiments of the invention.

FIG. 6 depicts a cross-sectional view of the interconnect structure 200 after a processing operation according to one or more embodiments of the invention. In some embodiments of the invention, an interlayer dielectric 602 is formed over the spacer 402 and the conductive line 202.

The interlayer dielectric 602 serves as an isolation structure for the lines and vias of the interconnect structure 200. The interlayer dielectric 602 can be made of any suitable dielectric material, such as, for example, low-k dielectrics (materials having a small dielectric constant relative to silicon dioxide, i.e., less than about 3.9), ultra-low-k dielectrics (materials having a dielectric constant less than 3), porous silicates, carbon doped oxides, silicon dioxides, silicon nitrides, silicon oxynitrides, silicon carbide (SiC), or other dielectric materials. Any known manner of forming the interlayer dielectric 602 can be utilized, such as, for example, CVD, PECVD, ALD, flowable CVD, spin-on dielectrics, or PVD.

Figure 7:
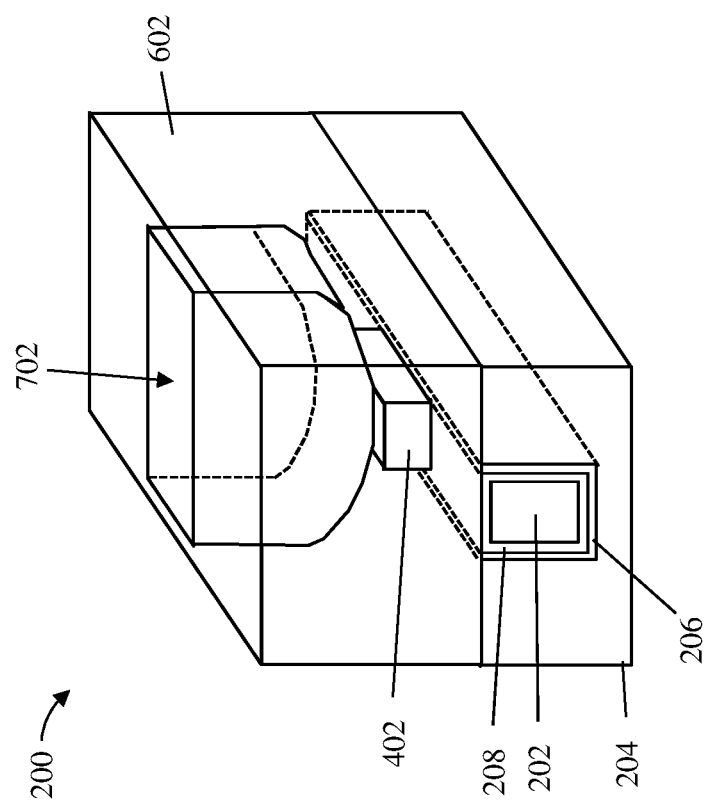
FIG. 7 depicts a cross-sectional view of the semiconductor structure after additional processing operations according to one or more embodiments of the invention.

FIG. 7 depicts a cross-sectional view of the interconnect structure 200 after a processing operation according to one or more embodiments of the invention. In some embodiments of the invention, portions of the interlayer dielectric 602 can be removed to form a trench 702 that exposes a top surface of the conductive spacer 402. In some embodiments of the invention, portions of the interlayer dielectric 602 are removed using a wet etch, a dry etch, or a combination of sequential wet and/or dry etches. In some embodiments of the invention, the interlayer dielectric 602 is patterned using a RIE. In some embodiments of the invention, the interlayer dielectric 602 is patterned selective to the conductive spacer 402.

Figure 8:
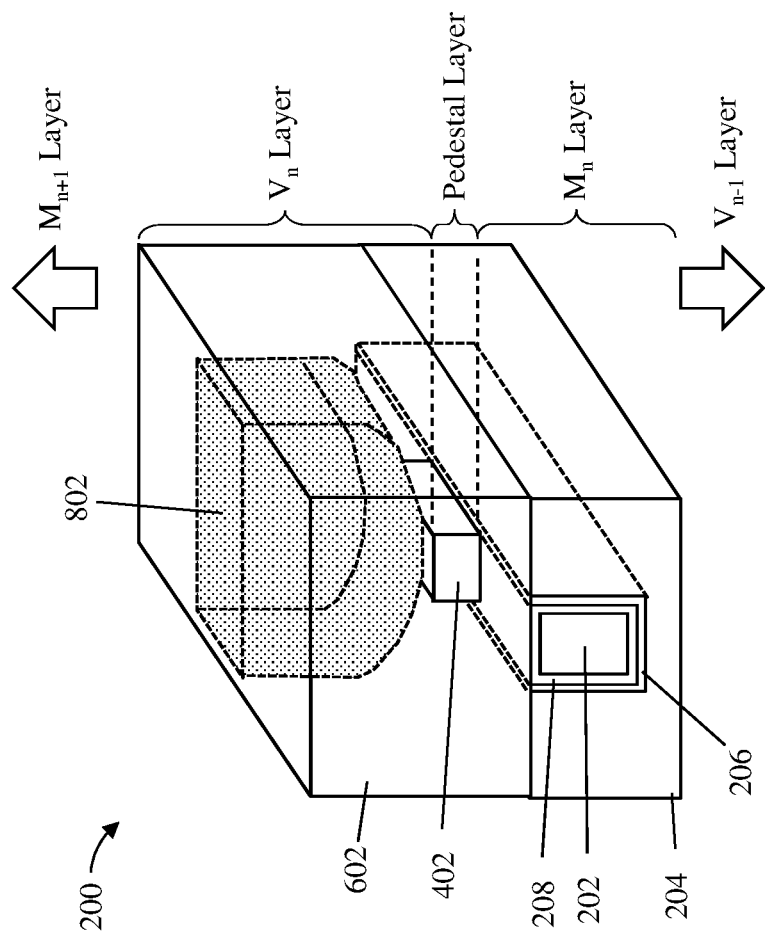
FIG. 8 depicts a cross-sectional view of the semiconductor structure after additional processing operations according to one or more embodiments of the invention.

FIG. 8 depicts a cross-sectional view of the interconnect structure 200 after a processing operation according to one or more embodiments of the invention. In the embodiment of the invention depicted in FIG. 8, a conductive material (e.g., a metal) is deposited in the trench 702 (shown in FIG. 7) to form a conductive via 802. In some embodiments of the invention, the conductive via 802 can be formed by overfilling the trench 702 with the conductive material, thereby forming an overburden that can be removed using, for example, a CMP process. In some embodiments of the invention, the conductive via 802 is selectively plated onto an exposed surface of the conductive spacer 402 using known processes. For example, the conductive material can include copper, the conductive spacer 402 can include ruthenium, and the copper used to form the conductive via 802 can be selectively plated onto a ruthenium surface of the conductive spacer 402 using electrochemical plating.

The conductive via 802 can be made of any suitable conducting material, such as, for example, metal (e.g., tungsten, titanium, tantalum, ruthenium, zirconium, cobalt, copper, aluminum, platinum), alloys thereof (such as AlCu, CuMn, CuTi, or the like), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the conductive via 802 includes copper plated onto a ruthenium pedestal. The conductive via 802 can be formed to any desired height by adjusting the thickness of the interlayer dielectric 602. In some embodiments of the invention, the conductive via 802 is formed to a height of 5 nm to 100 nm or more, for example 20 nm, although other via heights are within the contemplated scope of the invention.

As discussed previously herein, process difficulties faced when placing the conductive via 802 can result in excessive chamfering of the via. This chamfering can cause a short between the conductive via 802 and an adjacent line feature (e.g., a second line in the same "M" layer as the conductive line 202), especially as the line-to-line pitch continues to shrink for more advanced technology nodes. Advantageously, however, the insertion of a pedestal process module under the "V" layer (as shown in FIGS. 3-5) for forming the conductive spacer 402 physically prevents this short from occurring.

Moreover, the conductive spacer 402 can be selectively plated onto an exposed surface of the conductive line 202. For example, ruthenium can be selectively plated onto a copper surface using electrochemical plating. Consequently, the conductive spacer 402 can be formed in a manner that is not subject to excessive chamfering (in contrast to vias). In other words, the conductive spacer 402 is not a via and is not formed in the same manner as a via. Instead, the conductive spacer 402 is formed above the "M" layer and below the "V" layer.

While only a single "M" layer (e.g., the conductive line 202) and a single "V" layer (e.g., the conductive via 802) of the interconnect structure 200 are shown for ease of illustration, it is understood that the interconnect structure 200 can include any number of "M" layers and any number of "V" layers. Each of these "M" layers can be separated from the next "V" layer (the via layer above) by a pedestal layer formed in a similar manner as the conductive spacer 402.

In some embodiments of the invention, after forming the conductive via 802, one or more additional "M" layers alternating with one or more additional "V" layers can be formed over the interconnect structure 200 using conventional BEOL processes (shown as the "$M_{n+1}$ Layer" in FIG. 8). In other words, if the conductive line 202 defines a first "M" layer (i.e., a M1 layer), a second "M" layer (i.e., an M2 layer) can be formed over the "V1" layer (i.e., the conductive via 802 and the interlayer dielectric 602). Similarly, if the conductive via 802 defines a first "V" layer (i.e., a V1 layer), a second "V" layer (i.e., an V2 layer) can be formed over the "M2" layer. Moreover, a pedestal layer can be inserted between each pair of alternating "M" and "V" layers, as discussed previously herein. In this manner, any number of alternating "M" layers, "pedestal layers," and "V" layers can be formed over a substrate. In some embodiments of the invention, each of the "M" layers are electrically coupled to other "M" layers (below or above) through one or more of the "V" layer vias. For example, one of the conductive lines in the Mn+1 layer can be in electrical contact with the conductive via 802.

Figure 9:
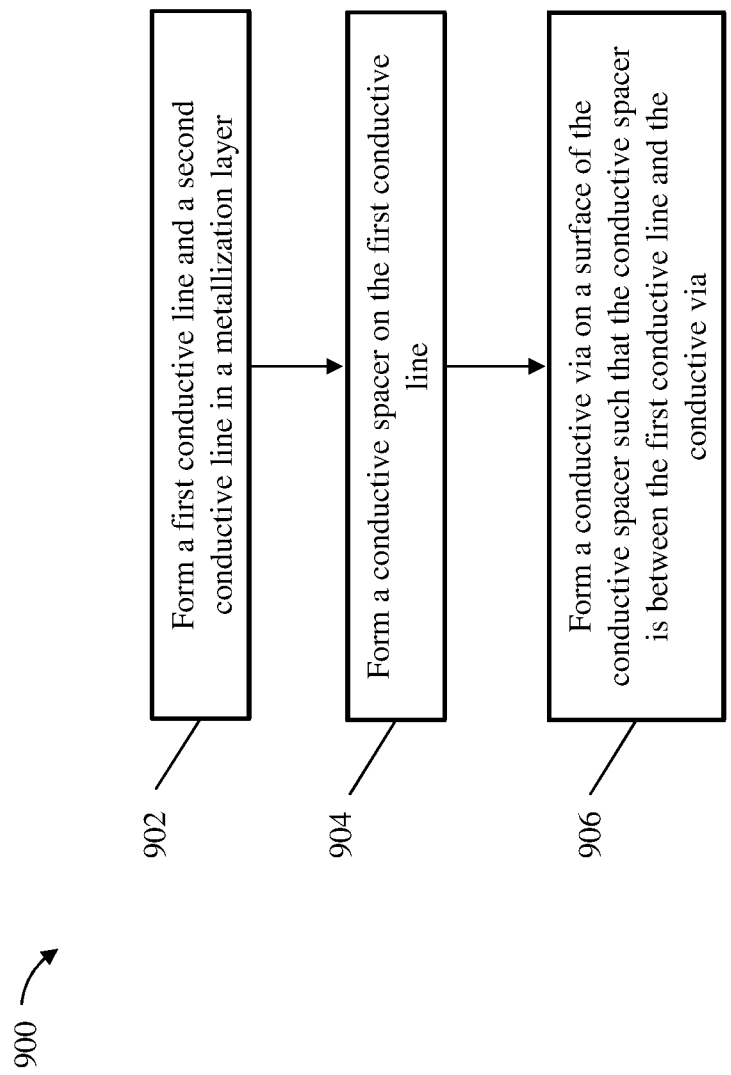
FIG. 9 depicts a flow diagram illustrating a method according to one or more embodiments of the invention.

FIG. 9 depicts a flow diagram 900 illustrating a method for forming a metallization region of an integrated circuit according to one or more embodiments of the invention. As shown at block 902, a first conductive line and a second conductive line are formed in a metallization layer of an interconnect structure. In some embodiments of the invention, the first conductive line and the second conductive line include a metal. In some embodiments of the invention, the first conductive line and the second conductive line include copper.

At block 904, a conductive spacer is formed on the first conductive line. In some embodiments of the invention, a height of the conductive spacer is selected to provide a predetermined distance from the conductive via to the second conductive line. In some embodiments of the invention, the predetermined distance from the conductive via to the second conductive line is sufficient to prevent a short between the conductive via and the second conductive line. In other words, a height of the conductive spacer is selected such that the conductive spacer physically prevents a short between a via and the first conductive line. In some embodiments of the invention, the conductive spacer includes ruthenium. In some embodiments of the invention, the conductive pedestal is selectively deposited on the surface of the first conductive line. In some embodiments of the invention, the conductive spacer includes a height of about 10 nm.

In some embodiments of the invention, forming the conductive spacer includes forming a trench in a hard mask that exposes a surface of the first conductive line and depositing the conductive spacer into the trench. In some embodiments of the invention, the hard mask is removed after forming the conductive spacer.

At block 906, a conductive via is formed on a surface of the conductive spacer. In some embodiments of the invention, the conductive via is positioned such that the conductive spacer is between the first conductive line and the conductive via. In some embodiments of the invention, forming the conductive via includes forming an interlayer dielectric over the first conductive line and the conductive spacer, forming a trench in the interlayer dielectric, and forming the conductive via on a surface of the conductive spacer in the trench. In some embodiments of the invention, the trench exposes a surface of the conductive spacer.

Figure 10:
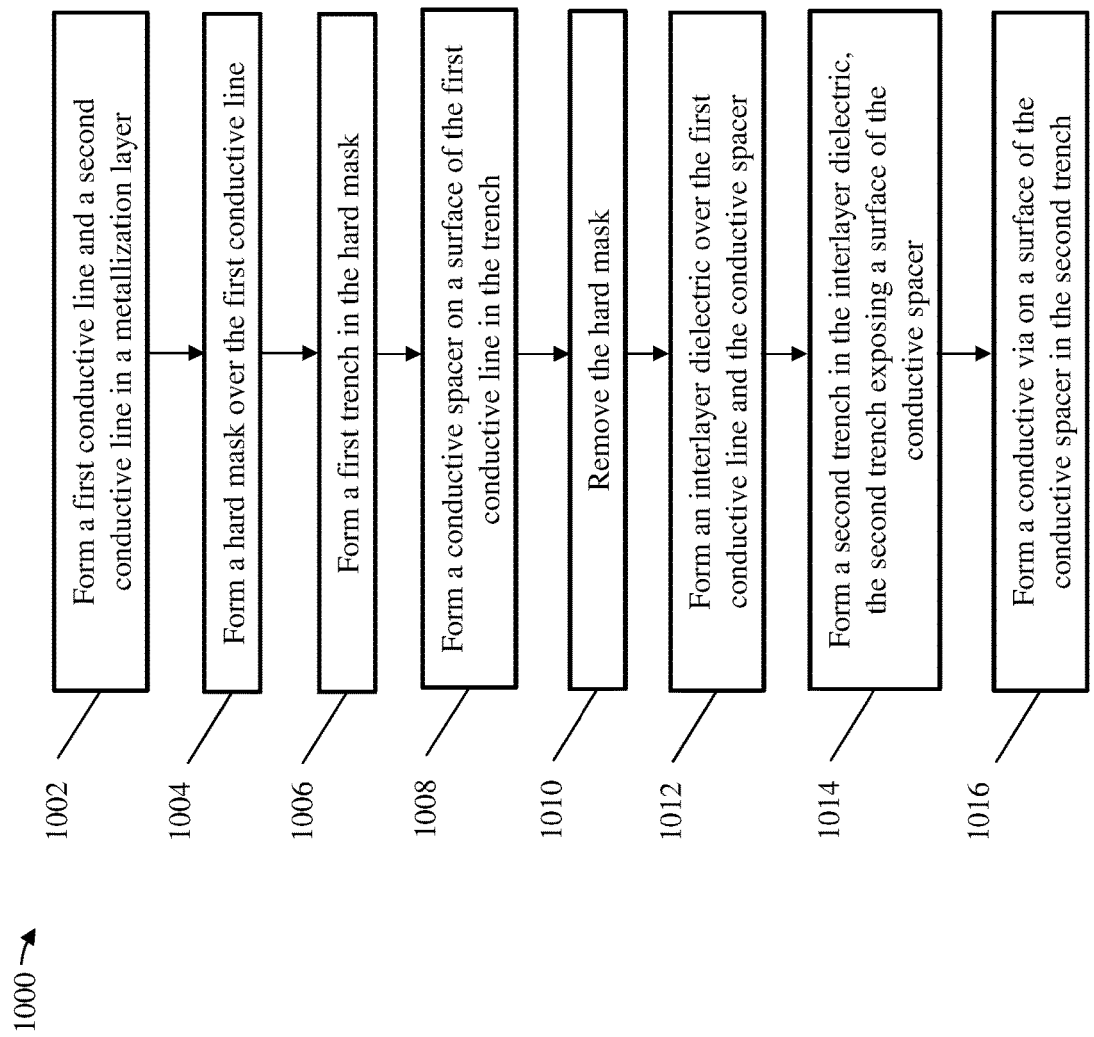
FIG. 10 depicts a flow diagram illustrating a method according to one or more embodiments of the invention.

FIG. 10 depicts a flow diagram 1000 illustrating a method for forming a metallization region of an integrated circuit according to one or more embodiments of the invention. As shown at block 1002, a first conductive line and a second conductive line are formed in a metallization layer of an interconnect structure. In some embodiments of the invention, the first conductive line and the second conductive line include a metal. In some embodiments of the invention, the first conductive line and the second conductive line include copper.

At block 1004, a hard mask is formed over the first conductive line. At block 1006, a first trench is formed in the hard mask. In some embodiments of the invention, the first trench exposes a surface of the first conductive line.

At block 1008, a conductive spacer is formed on a surface of the first conductive line in the trench. In some embodiments of the invention, a height of the conductive spacer is selected such that the conductive spacer physically prevents a short between the via and the line feature. In some embodiments of the invention, the conductive spacer includes a height of about 5 nm to about 50 nm. In some embodiments of the invention, the conductive spacer includes a height of about 10 nm. In some embodiments of the invention, the conductive spacer includes ruthenium selectively deposited on the surface of the first conductive line.

At block 1010, the hard mask is removed, exposing a surface of the first conductive line and sidewalls of the conductive spacer. At block 1012, an interlayer dielectric is formed over the first conductive line and the conductive spacer. At block 1014, a second trench is formed in the interlayer dielectric. In some embodiments of the invention, the second trench exposes a surface of the conductive spacer. At block 1016, a conductive via is formed on a surface of the conductive spacer in the second trench.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a metallization region of an integrated circuit, the method comprising:
    forming a first conductive line and a second conductive line in a first metallization layer of an interconnect structure, the first conductive line positioned adjacent to the second conductive line in the first metallization layer;
    forming a conductive spacer on the first conductive line, wherein forming the conductive spacer comprises:
        forming a trench in a hard mask, the trench exposing a surface of the first conductive line;
        depositing the conductive spacer into the trench; and
        removing the hard mask after depositing the conductive spacer;
    forming a conductive via on a surface of the conductive spacer, the conductive via positioned such that the conductive spacer is between the first conductive line and the conductive via, wherein a portion of the conductive via comprises a chamfered region that overlaps a portion of the second conductive line; and
    forming a third conductive line in a second metallization layer of the interconnect structure, the third conductive line formed directly on the conductive via such that the conductive via electrically couples the first metallization layer to the second metallization layer;
    wherein a height of the conductive spacer is selected to provide a predetermined distance from the conductive via to the second conductive line; and
    wherein the predetermined distance from the conductive via to the second conductive line is defined as the distance required to prevent contact between the conductive via and the second conductive line at any degree of chamfering of the conductive via.

2. The method of claim 1, wherein forming the conductive via comprises:
    forming an interlayer dielectric over the first conductive line and the conductive spacer;
    forming a trench in the interlayer dielectric, the trench exposing a surface of the conductive spacer; and
    forming the conductive via on a surface of the conductive spacer in the trench.

3. The method of claim 1, wherein the first conductive line comprises a metal line.

4. The method of claim 3, wherein the first conductive line comprises copper.

5. The method of claim 4, wherein the conductive spacer comprises ruthenium.

6. The method of claim 5, wherein the conductive spacer is selectively deposited on the surface of the first conductive line.

7. The method of claim 1, wherein the conductive spacer comprises a height of about 10 nm.

* * * * *